US 9,024,663 B2

(12) United States Patent
Rohleder et al.

(10) Patent No.: US 9,024,663 B2
(45) Date of Patent: May 5, 2015

(54) CLOCK GLITCH DETECTION CIRCUIT

(71) Applicants: Michael Rohleder, Unterschleissheim (DE); Thomas Koch, Kaufering (DE); Vladimir Litovtchenko, Ebersberg (DE); Thomas Luedeke, Oberbergkirchen (DE)

(72) Inventors: Michael Rohleder, Unterschleissheim (DE); Thomas Koch, Kaufering (DE); Vladimir Litovtchenko, Ebersberg (DE); Thomas Luedeke, Oberbergkirchen (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/015,519

(22) Filed: Aug. 30, 2013

(65) Prior Publication Data
US 2014/0006841 A1    Jan. 2, 2014

Related U.S. Application Data

(62) Division of application No. 13/131,349, filed as application No. PCT/IB2009/050011 on Jan. 5, 2009, now Pat. No. 8,552,764.

(51) Int. Cl.
| | |
|---|---|
| H03K 5/19 | (2006.01) |
| H03K 9/06 | (2006.01) |
| G06F 1/04 | (2006.01) |
| H03K 5/1252 | (2006.01) |

(52) U.S. Cl.
CPC ............... *G06F 1/04* (2013.01); *H03K 5/1252* (2013.01)

(58) Field of Classification Search
None
See application file for complete search history.

(56) References Cited

U.S. PATENT DOCUMENTS

| 4,330,751 | A | * | 5/1982 | Swain ........................... 327/114 |
|---|---|---|---|---|
| 4,389,622 | A | | 6/1983 | Kackman |
| 4,864,158 | A | * | 9/1989 | Koelle et al. .................... 327/31 |
| 5,381,126 | A | | 1/1995 | McClure |
| 5,526,286 | A | | 6/1996 | Sauerwein et al. |
| 5,721,944 | A | | 2/1998 | Gallet et al. |
| 5,764,524 | A | * | 6/1998 | Andersson et al. ............. 702/79 |
| 5,812,250 | A | | 9/1998 | Ishida et al. |
| 5,923,191 | A | * | 7/1999 | Nemetz et al. .................. 327/20 |
| 6,285,396 | B1 | | 9/2001 | Har Shoshanim et al. |

(Continued)

FOREIGN PATENT DOCUMENTS

| GB | 1452559 | 10/1976 |
|---|---|---|
| JP | 2006005576 | 1/2006 |

(Continued)

OTHER PUBLICATIONS

Chan, Y.C. et al., "The Autonomous Detection of Clock Problems in Satellite Timekeeping Systems," 31st Annual Precise Time and Time Interval (PTTI) Meeting, Dec. 7-9, 1999; pp. 111-120; printed from <<http://tycho.usno.navy.mil/ptti/ptti99/PTTI_1999_111.PDF>> on Nov. 12, 2012.

(Continued)

*Primary Examiner* — Tuan T Lam

(57) ABSTRACT

In a first circuit for detecting clock glitches in a clock signal, a master counter is clocked by the clock signal and memorizes a master count. An incrementer advances the master count by one increment. A slave counter is clocked by the clock signal and memorizes a slave count. The slave count is retarded relative to the master count by at least a particular number of clock edges. A comparator determines whether the difference between the master count and the slave count is at least a value of the incrementer times the particular number of clock edges.

20 Claims, 5 Drawing Sheets

(56) References Cited

U.S. PATENT DOCUMENTS

| | | | |
|---|---|---|---|
| 6,535,024 B1 | 3/2003 | Rochard | |
| 6,543,027 B1 | 4/2003 | Hughes et al. | |
| 6,728,649 B2 | 4/2004 | McMahan et al. | |
| 6,825,705 B2 * | 11/2004 | Kato et al. | 327/291 |
| 7,129,757 B2 * | 10/2006 | Geer et al. | 327/12 |
| 7,352,214 B2 | 4/2008 | Evans et al. | |
| 7,372,304 B2 | 5/2008 | Fruhauf et al. | |
| 7,592,843 B1 | 9/2009 | Fong | |
| 7,714,619 B2 * | 5/2010 | Yamada | 327/18 |
| 8,115,516 B2 | 2/2012 | Bode et al. | |
| 8,519,768 B2 | 8/2013 | Baumeister et al. | |
| 2003/0058013 A1 | 3/2003 | Cole | |
| 2003/0146778 A1 | 8/2003 | McMahan et al. | |
| 2005/0012525 A1 * | 1/2005 | Starr et al. | 327/18 |
| 2006/0076984 A1 | 4/2006 | Lu et al. | |
| 2006/0097756 A1 * | 5/2006 | Minzoni | 327/26 |
| 2007/0075746 A1 | 4/2007 | Fruhauf et al. | |
| 2007/0096774 A1 | 5/2007 | Yang et al. | |
| 2007/0120584 A1 | 5/2007 | Carlile et al. | |
| 2007/0236257 A1 | 10/2007 | Kejriwal | |
| 2011/0317802 A1 | 12/2011 | Rohleder et al. | |

FOREIGN PATENT DOCUMENTS

| | | |
|---|---|---|
| JP | 2008103863 A | 5/2008 |
| KR | 10-2001-0059722 A | 7/2001 |
| KR | 10-2002-0053267 A | 7/2002 |
| KR | 10-2003-0050867 A | 6/2003 |

OTHER PUBLICATIONS

PCT International Search Report mailed Sep. 28, 2009 for PCT/IB2009/050011, 3 pages.

* cited by examiner

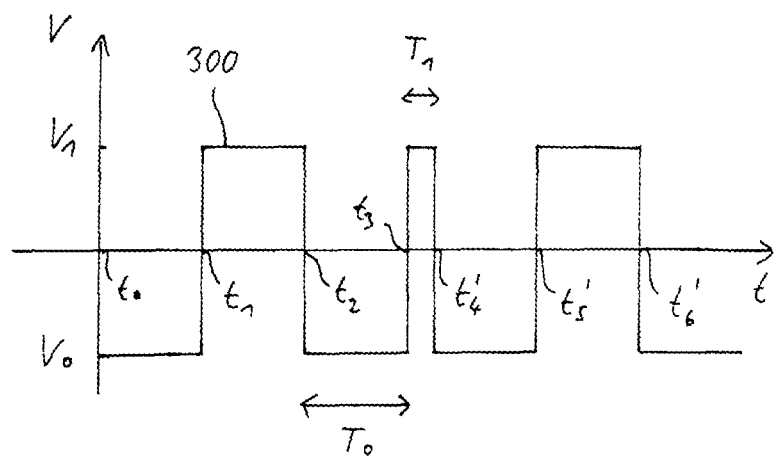
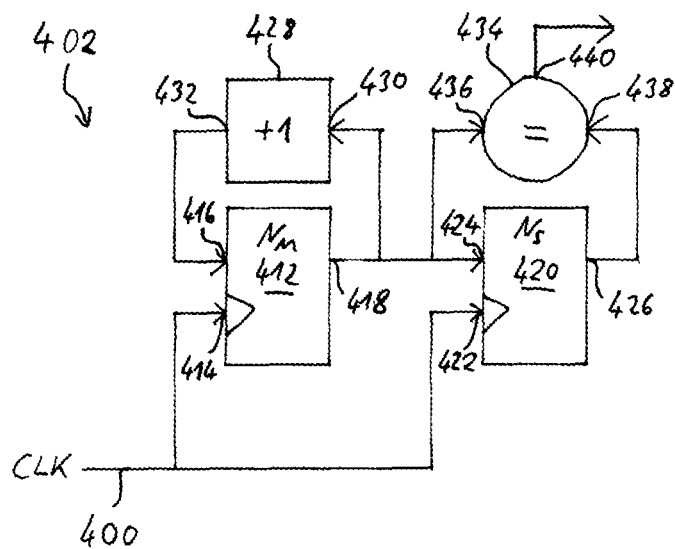

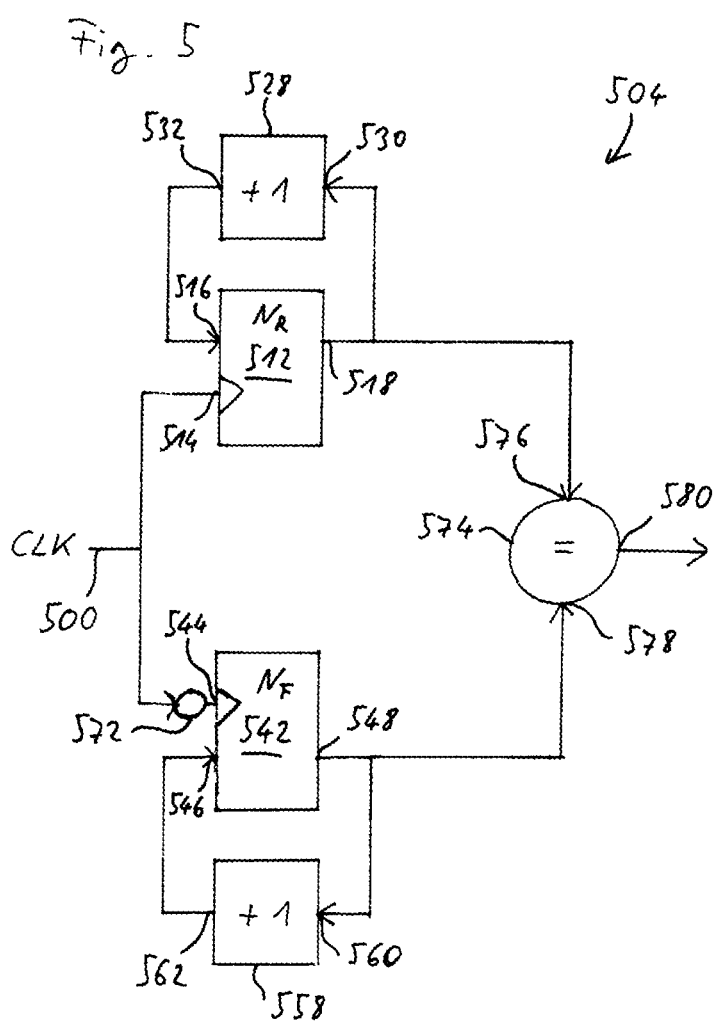

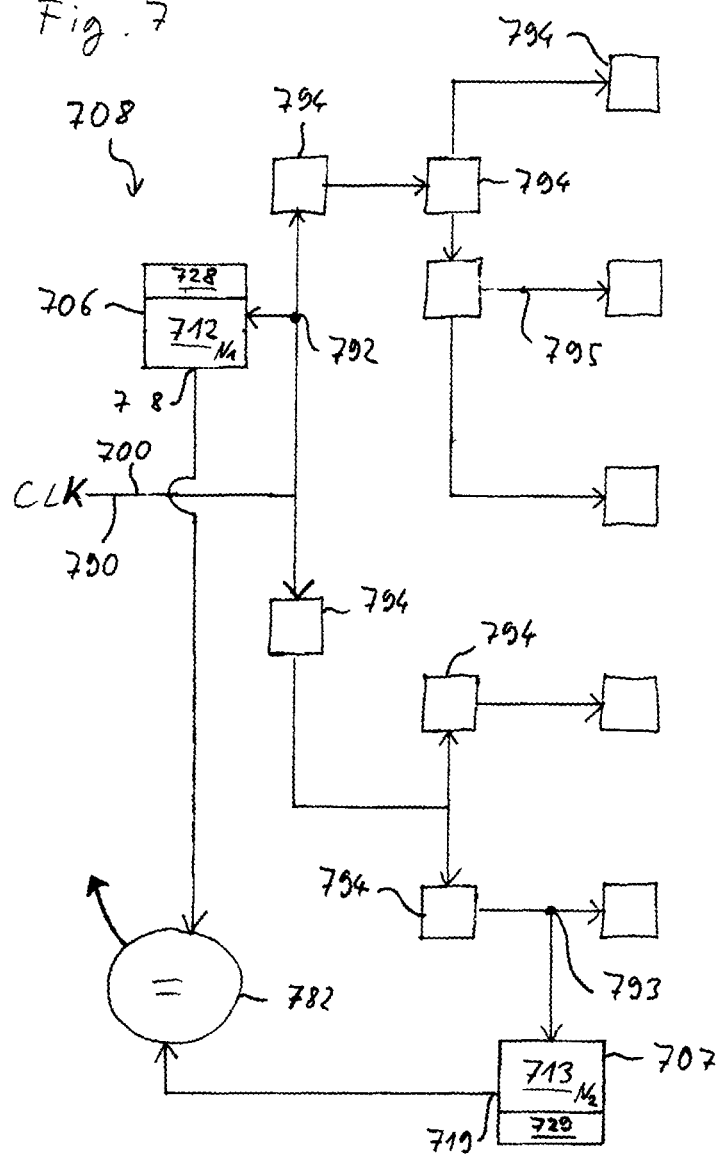

CLOCK GLITCH DETECTION CIRCUIT

CROSS-REFERENCE TO RELATED APPLICATION(S)

This application is a divisional of U.S. patent application Ser. No. 13/131,349, entitled "Clock Glitch Detection Circuit," filed on May 26, 2011, now U.S. Pat. No. 8,552,764, which is a National Stage Entry under 37 C.F.R. §371 of PCT/IB2009/050011, filed Jan. 5, 2009, the disclosures of which are hereby expressly incorporated by reference in their entirety.

FIELD OF THE DISCLOSURE

This invention relates to a circuit for detecting clock glitches in a clock signal.

The invention also relates to a synchronous circuit comprising a clock tree.

The invention further relates to a circuit for being integrated in the synchronous circuit.

BACKGROUND

Schematically shown in FIG. 1 is a plot of an idealized clock signal 100. The clock signal 100 is presented, by way of example, as an electrical voltage V varying as a function of time t. More generally, the clock signal is the time-dependence of a physical quantity. For example, the clock signal could be provided optically by a variation of an intensity of light. The signal V(t) shown here is a regular succession of high and low values, $V_0$ and $V_1$, respectively. The low values last a time $T_0$, the high values last a time $T_1$. In the example shown, $T_0$ and $T_1$ are equal, but other ratios configurations are also commonly used in the art. Transitions from the low value $V_0$ to the high value $V_1$ are referred to as a rising edges. In the example, rising edges occur at equidistant times $t_1$, $t_3$, and $t_5$. Transitions from the high value $V_1$ to the low value $V_0$ are termed falling edges. In the example, falling edges occur at equidistant times $t_0$, $t_2$, and $t_4$. Rising edges and falling edges are summarily referred to as clock edges.

Any synchronous circuit relies on the presence of a clock signal similar to the one illustrated in the Figure. Operations to be performed by the components of the circuit are triggered by clock edges, for example, only by rising edges, or only by falling edges, or by both falling and rising edges. After an operation has been performed, the component waits for the next edge before executing the next operation. The various components can thus be synchronized. Any component thus controlled by the clock signal is said to be clocked by the clock signal.

Usually a problem arises if an edge in the clock signal is generated early, late, or unexpectedly. Less critical are cases, where the interval between two subsequent edges is longer than usual, for example, due to a stall of the device generating the clock signal. In contrast, functional errors may occur if either $T_0$ or $T_1$ (or both) are shorter than expected. These are typical examples of clock glitches. In these cases, components of the synchronous circuit may still be busy with an operation when receiving the edge and therefore the edge will either not trigger an action or trigger a faulty action. In FIG. 2, the time $T_0'$ is shorter than expected. In FIG. 3, the time $T_1'$ is shorter than expected.

Clock glitches are a prominent root cause for many functional errors of an electronic device. In case of devices targeted for safety related applications the detection of clock glitches is of special importance, since many common cause failures are either generated by clock glitches or will also result in clock glitches.

SUMMARY

The present invention provides circuits for detecting clock glitches in a clock signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

FIG. 3 shows a schematic diagram of an example of a clock signal having a different clock glitch.

FIG. 4 schematically shows an example of an embodiment of a circuit for detecting clock glitches.

FIG. 5 schematically shows an example of an embodiment of another circuit for detecting clock glitches.

FIG. 7 schematically shows an example of an embodiment of a circuit comprising a clock tree and two detectors for detecting clock glitches.

DETAILED DESCRIPTION OF PREFERRED EMBODIMENTS

Figure 1:
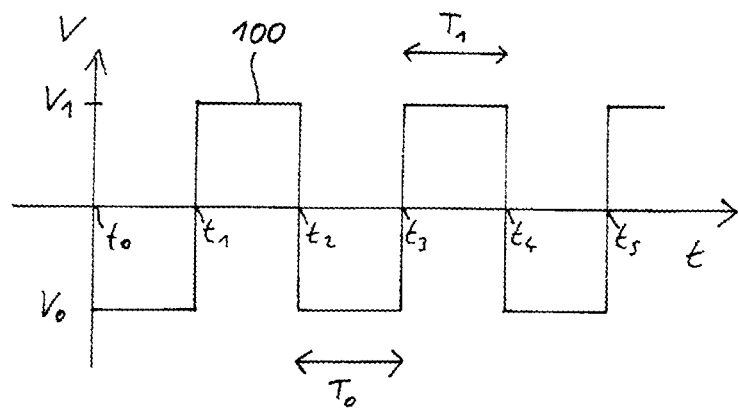
FIG. 1 shows a schematic diagram of an example of an ideal clock signal.
Figure 2:
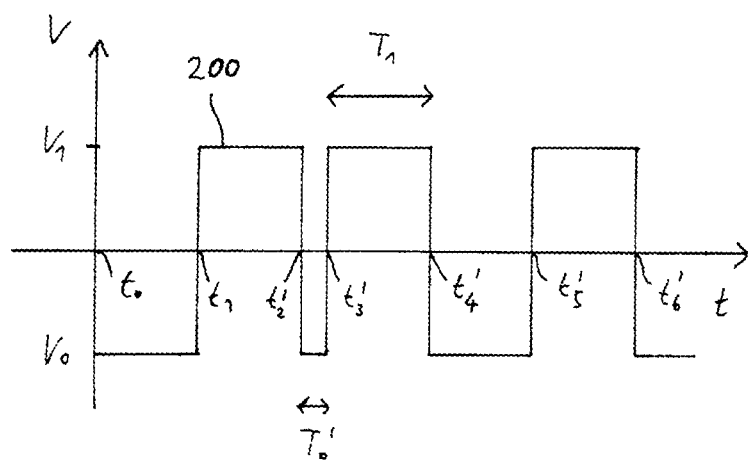
FIG. 2 shows a schematic diagram of an example of a clock signal having a clock glitch.

Referring now to FIG. 4, there is shown a circuit 402 for detecting clock glitches in a clock signal 400. The circuit 402 comprises: a master counter 412 clocked by the clock signal 400, for memorizing a master count $N_M$; an incrementer 428 for advancing the master count by one increment; and a slave counter 420 clocked by the clock signal, for memorizing a slave count $N_S$. In the present example, the increment is +1. However, it is worth to note that any other encodings and increments may be used for the counter; for example hamming codes may be used for this purpose. The circuit 402 is configured such that the slave count $N_S$ is retarded relative to the master count by at least P clock edges, the number P being greater than or equal to one. The circuit further comprises a comparator 434 for determining whether the difference $N_M - N_S$ between the master count and the slave count is at least P times the increment. In the present example, P equals one.

The circuit 402 operates as follows. At a particular instant before an edge in the clock signal, the master count is $N_M$ while the slave count is typically $N_S = N_M - 1$. This difference is explained by the fact that both master counter and the slave counter are clocked. During normal operation this difference persists. However, the incrementor 428, like any input/output device, has an intrinsic delay. If a triggering edge occurs while the incrementor's output has not yet adapted to a new value $N_M$ provided at its input 430, the master counter 412 will not advance in spite of being triggered by the edge. The master counter 412 will simply be set again to its current value $N_M$. At the same time, the slave counter 420 will be triggered by the edge to set the slave count equal to the master count. The slave count thus catches up with the master count. It should be noted that the slave count remains retarded relative to the master count in the sense that at any point in time the slave counter indicates the master count of a previous clock cycle. However, in the case of the master counter failing to advance, the retardation is not apparent from a difference between the master count and the slave count. After the slave counter 420 has advanced, the comparator 440 will detect that the master count and the slave count do not differ as expected, and it will generate an error signal.

The comparator 434 or its result may be qualified by the clock signal 400. For example, the comparator 434 may be activated or an evaluation of the comparison result may be activated by the clock signal only when a valid result signal can be delivered. Thereby it may be ensured that the slave count and the master count are compared only at a correct point in time during a clock cycle. The incrementer 428 is combinatorial in the present example. In the example shown, the master counter 412 and the slave counter 420 are wrap-around counters having the same range. Their range may, for example, consist of the integer numbers from zero to $2^n-1$, where n is an integer constant. For example, the range may be zero to one (the smallest possible range), or zero to three, or zero to seven, or zero to fifteen. In principal, n can be any integer number equal to or larger than one. The usage of different encodings or representations for the given range by the counters (e.g. Hamming codes) are also possible and often beneficial due to their better stability with respect to timing variances. The master counter 412 comprises a storage element for memorizing the master count $N_M$ while the slave counter 420 comprises a storage element for memorizing the slave count $N_S$. Each of these storage elements may be provided, for example, by a register, an assembly of flip-flops, a latch, or a memory. A register and or an assembly of flip-flops may be advantageous because of their greater speed, reduced size requirements or enhanced stability with respect to environmental conditions.

The master counter 412 and the slave counter 420 may be constructed in the same manner. The master counter 412 has an input port 416 for setting the master count and an output port 418 for delivering the master count. The slave counter 420 has an input port 424 for setting the slave count and an output port 426 for delivering the slave count. The master counter's output port 418 is coupled to the slave counter's input port 424. More specifically, the master counter's output port 418 is coupled directly to the slave counter's input port 424. The incrementer 428 has an input port 430 for receiving an input number and an output port 432 for delivering an output number, the output number being the input number plus one increment. The increment may be a constant integer number, such as +1 or −1 or any other increment imposed by the chosen encoding for the counter values. The master counter's output port 418 is coupled to the incrementer's input port 430 and the incrementer's output port 432 is coupled to the master counter's input port 416. The comparator 434 has a first input port 436 for receiving a first input number, a second input port 438 for receiving a second input number, and an output port 440 for delivering a comparator signal depending on the difference between the first input number and the second input number. The master counter's output port 418 is coupled to the comparator's first input port 436 and the slave counter's output port 426 is coupled to the comparator's second input port 438.

Both the master counter 412 and the slave counter 420 may have a capture time that is shorter than a delay of the incrementor 420. The delay of the incrementor is the delay of delivering the output signal of the incrementer 434 (delivered at the output port 432) with respect to receiving the input signal (received at the input port 430). The capture time is understood to be the minimum time during which an input count needs to be applied at the counter's input port 416 (for the master counter 412) or 424 (for the slave counter 420) to be able to capture the input count. Once the input count has been captured, it is delivered at the output port 418 or 426 when the counter 412 or 420 is triggered by the subsequent clock edge (or the subsequent rising edge, or the subsequent falling edge, depending on details of the implementation). It is noted that an additional (small) delay exists between the instant at which the counter 412 or 420 receives the triggering clock edge and the instant at which the captured count is actually delivered at the output port 418 or 426. This additional delay may be referred to as the output delay. For this example, the described device is capable to detect clock glitches faster than the intrinsic delay of the incrementer 428, but larger than the capture time of the slave counter 420.

In a synchronous system comprising the circuit 420 at least the slave counter may have a capture time not longer (e.g. shorter) than the capture times and/or reaction times of any other component of the synchronous system. In particular the slave count capture time may be chosen to be as short as possible. Thereby, it can be ensured to detect any clock glitch (faster than the intrinsic delay of the incrementer) that results in a functional effect. Otherwise it will not be detected, but also have no effect on other parts of the device. It should be noted that the circuit 402 will not necessarily detect all clock glitches possibly present in the clock signal 400. In particular, if subsequent triggering edges in the clock signal are separated by a time gap shorter than the capture time of the master counter or the slave counter, one or both counters may not be modified. By properly chosing the implementation and technology parameters of the incrementer and the counters, a detection window can be easily specified.

Shown in FIG. 5 is an example of a circuit 504 for being integrated in a synchronous circuit 708 described further below with reference to FIG. 7. It is noted that the circuit 504 may also be useful without being integrated in the synchronous circuit 708. The circuit 504 comprises a rising-edge counter 512 triggered by rising edges in the clock signal 500, 700, for memorizing a rising-edge count $N_R$; a falling-edge counter 542 triggered by falling edges in the clock signal, for memorizing a falling-edge count $N_F$; a rising-edge incrementer 528 for advancing the rising-edge count $N_R$ by one increment; a falling-edge incrementer 558 for advancing the falling-edge count $N_F$ by one increment; a comparator 574 for determining the difference $N_R-N_F$ between the rising-edge count $N_R$ and the falling edge count $N_F$, or for determining whether the rising-edge count $N_R$ and the falling edge count $N_F$ differ. This comparator 574 or its result 580 may for example be qualified by one of both input clocks 514 or 546 to provide only valid results and not intermediate count differences. If $N_R$ and $N_F$ are found to differ, an error signal may be generated, the error signal indicating that a clock glitch has been detected. The circuit 504 may further comprise an inverter 572 for generating an amplitude-inverted clock signal in response to the clock signal 500 or receive the inverted clock directly from another component in the system that has generated it. It may further comprise the circuit 402 as described above with reference to FIG. 4; in this case the rising-edge counter 512 or the falling-edge counter 542 is the master counter 412.

Figure 6:
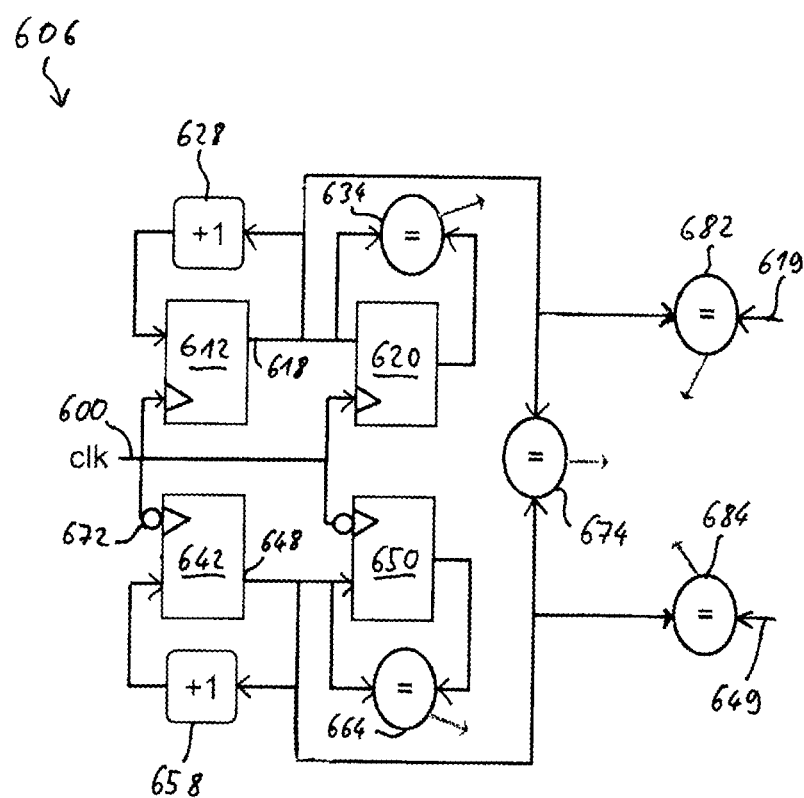
FIG. 6 schematically shows an example of an embodiment of a circuit for detecting clock glitches, the circuit comprising circuits as discussed with reference to FIG. 4 and FIG. 5, respectively.

Referring to FIG. 6, there is illustrated a circuit 606 for detecting clock glitches in a clock signal 600. The circuit 606 combines features already discussed above with reference to FIGS. 4 and 5, and is therefore discussed only briefly. The circuit comprises a master counter 612 and a corresponding slave counter 620 clocked both by the clock signal 600. The master-slave arrangement detects clock glitches in the manner as described above with reference to FIG. 4. It further comprises a master counter 642 and a corresponding slave counter 650 clocked both by an inverted clock signal generated from the clock signal 600 by inverting its amplitude. While the first master-slave arrangement 612, 628, 620, 634 is rising-edge triggered, the second master-slave arrangement 672, 642, 650, 658, 644 is falling-edge triggered. A first master count delivered by the first master-slave arrangement 612, 628, 620, 634 at output port 618 is compared to a second master count delivered by the second master-slave arrangement 672, 642, 650, 658, 644 at output port 648 by means of a comparator 674. Should the first master count and the second master count differ, an error signal is generated. The circuit described above with reference to FIG. 4 may therefore represent a first instance 612, 620, 628, 634 that is arranged to memorize positive clock edges, and a further circuit as described above with reference to FIG. 4 may represent a second instance 642, 650, 658, 664 arranged to memorize negative clock edges, and a comparator 674 for determining the difference $N_R - N_F$ between the rising-edge count $N_R$ and the falling-edge count $N_F$ may be provided.

Furthermore, the rising-edge count from output 618 is compared by a comparator 682 to a master count received from an output 619 of a second circuit 607 (not shown in this Figure but analogous to circuit 707 in FIG. 7), the second circuit 607 receiving the clock signal 600 from a different point in a clock tree (not shown in this Figure). Analogously, the falling-edge count from output 648 is compared by a comparator 684 to a corresponding falling-edge count received from an output 649 of the second circuit 607. If the counts at outputs 648 and 649 are found to differ, an error signal is generated.

Referring now to FIG. 7, the synchronous circuit 708 represented therein comprises a clock tree 790, 792, 793, 794, 795 for transmitting a clock signal 700 from a start point 790 to one or more other points. The start point and the other points comprise a first point 792 and second point 793. By way of example, the clock tree shown here comprises a plurality of different, similar or identical synchronous components (sinks) 794 to which the clock signal is transmitted. Some of the components 794 transmit the clock signal further to other components 794. The synchronous circuit 708 further comprises a first counter 712 clocked by the clock signal at the first point 792, for memorizing a first count $N_1$, a first incrementer 728 for advancing the first count $N_1$ by one increment, a second counter 713 clocked by the clock signal at the second point 793, for memorizing a second count $N_2$, a second incrementer 729 for advancing the second count $N_2$ by one increment, and a comparator 782 for determining the difference $N_1 - N_2$ between the first count $N_1$ and the second count $N_1$, or for determining whether the first count $N_1$ and the second count $N_2$ differ. The synchronous circuit 708 may comprise the circuit 402 described above with reference to FIG. 4, wherein the master counter 412 is the first counter 712. The comparator 782 may be clocked by the clock signal 700. The first counter 712 and the second counter 713 are constructed in the same manner. The synchronous circuit 708 may also comprise the synchronous circuit 504 discussed above with reference to FIG. 5. That is, the synchronous circuit 708 comprises (components labeled by reference numerals beginning with a "5" are shown in FIG. 5) a rising-edge counter 512 triggered by rising edges in the clock signal 500, 700, for memorizing a rising-edge count $N_R$; a falling-edge counter 542 triggered by falling edges in the clock signal, for memorizing a falling-edge count $N_F$; a rising-edge incrementer 528 for advancing the rising-edge count $N_R$ by one increment; a falling-edge incrementer 558 for advancing the falling-edge count $N_F$ by one increment; a comparator 574 for determining the difference $N_R - N_F$ between the rising-edge count $N_R$ and the falling edge count $N_F$, or for determining whether the rising-edge count $N_R$ and the falling edge count $N_F$ differ, wherein the first counter 712, the first count $N_1$, and the first incrementer 728 are the rising-edge counter 512, the rising-edge count $N_R$, and the rising-edge incrementer 528, respectively. If a difference between corresponding counts is detected, an error signal is generated. In the embodiment shown, the first counter 712 and the first incrementer 728 are components of a distinct clock glitch detector 706 which may be connected to an arbitrary point of the clock tree. For example, the clock glitch detector 706 could alternatively be connected to a point 795. The design of the clock glitch detector 706 is analogous to the circuit 606 described above with reference to FIG. 6. Similarly, the second counter 713 and the second incrementer 728 are components of a clock glitch detector 707 constructed in the same manner as clock glitch detector 706.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

As used herein, the term "bus" is used to refer to a plurality of signals or conductors which may be used to transfer one The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals. In particular, the terms "rising edge" and "falling edge" are interchangeable.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Also for example, in one embodiment, the illustrated elements of system 708 are circuitry located on a single integrated circuit or within a same device. Alternatively, system 708 may include any number of separate integrated circuits or separate devices interconnected with each other. For example, detector 706 may be located on a same integrated circuit as detector 707 on a separate integrated circuit or located within another peripheral or slave discretely separate from other elements of system 708. Also for example, system 708 or portions thereof may be soft or code representations of physical circuitry or of logical representations convertible into physical circuitry. As such, system 708 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, detectors 706 and 707 may be connected to physically separated branches of the clock tree, the clock signal being distributed by a telecommunication modality rather than by a wire. Also, devices functionally forming separate devices may be integrated in a single physical device. For example, the two detectors 706 and 707 may form a single device have ports for be coupled to different points of the clock tree.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

What is claimed is:

1. A synchronous circuit comprising:
a clock tree configured to transmit a clock signal from a start point to one or more other points, wherein the start point and the other points include a first point and second point;
a first counter clocked by the clock signal at the first point, wherein the first counter is configured to store a first count;
a first incrementer configured to advance the first count by one increment;
a second counter clocked by the clock signal at the second point, wherein the second counter is configured to store a second count;
a second incrementer configured to advance the second count by one increment; and
a comparator configured to determine one of a difference between the first count and the second count or whether the first count and the second count differ.

2. The synchronous circuit of claim 1, wherein the comparator or its result is activated by the clock signal.

3. The synchronous circuit of claim 1, further comprising:
a falling-edge counter triggered by falling edges in the clock signal and configured to store a falling-edge count; and
a falling-edge incrementer configured to advance for advancing the falling-edge count by one increment.

4. The synchronous circuit of claim 1 further comprising:
a rising-edge counter triggered by rising edges in the clock signal and configured to store a rising-edge count; and
a rising-edge incrementer configured to advance the rising-edge count by one increment.

5. The synchronous circuit of claim 4 wherein the first counter includes the rising-edge counter, the first count includes the rising-edge count, and the first incrementer includes the rising-edge incrementer.

6. The synchronous circuit of claim 4 further comprising:
a falling-edge counter triggered by falling edges in the clock signal and configured to store a falling-edge count; and
a falling-edge incrementer configured to advance for advancing the falling-edge count by one increment.

7. The synchronous circuit of claim 6 further comprising:
a second comparator configured to determine one of a difference between the rising-edge count and the falling edge count or whether the rising-edge count and the falling edge count differ.

8. The synchronous circuit of claim 7 further comprising
an inverter configured to generate an amplitude-inverted clock signal in response to the clock signal, wherein an output of the inverter is provided to an input of the falling edge counter.

9. A synchronous circuit comprising:
a clock tree configured to transmit a clock signal from a start point to one or more other points, wherein the start point and the other points include a first point and second point;
a rising-edge counter in communication with the clock tree, the rising-edge counter configured to be triggered by rising edges in the clock signal, and to store a rising-edge count, wherein the rising-edge counter is at the first point;
a falling-edge counter in communication with the clock tree, the falling-edge counter configured to be triggered by falling edges in the clock signal, and to store a falling-edge count, wherein the falling-edge counter is at the second point; and
a rising-edge incrementer in communication with the rising-edge counter, the rising-edge incrementer configured to advance the rising-edge count by one increment;
a falling-edge incrementer in communication with the falling-edge counter, the falling-edge incrementer configured to advance the falling-edge count by one increment; and
a comparator in communication with the rising-edge counter and the falling edge counter, the comparator configured to determine a difference between the rising-edge count and the falling edge count, or to determine whether the rising-edge count and the falling edge count differ.

10. The synchronous circuit of claim 9, wherein the comparator is further configured to generate an error signal in response to the rising-edge count differing from the falling-edge count.

11. The synchronous circuit of claim 10, wherein error signal indicates that a clock glitch has been detected.

12. The synchronous circuit of claim 9, further comprising:
an inverter in communication with the clock tree and the falling-edge counter, the inverter configured to provide an amplitude-inverted clock signal to the falling-edge counter.

13. The synchronous circuit of claim 9, wherein the comparator or its result is activated by the clock signal.

14. A method comprising
transmitting, by a clock tree, a clock signal from a start point to one or more other points, wherein the start point and the other points comprising a first point and second point;
clocking, by the clock signal, a first counter at the first point, wherein the first counter is configured to store a first count;
advancing, by a first incrementer, the first count by one increment;
clocking, by the clock signal, a second counter at the second point, wherein the second counter is configured to store a second count;
advancing, by a second incrementer, the second count by one increment; and
determining one of a difference between the first count and the second count or whether the first count and the second count differ.

15. The method of claim 14, wherein the first counter and the second counter are constructed in the same manner.

16. The method of claim 14, further comprising:
triggering a rising-edge counter based on rising edges in the clock signal;
storing a rising-edge count; and
advancing, by a rising-edge incrementer, the rising-edge count by one increment.

17. The method of claim 16 wherein the first counter includes the rising-edge counter, the first count includes the rising-edge count, and the first incrementer includes the rising-edge incrementer.

18. The synchronous circuit of claim 16 further comprising:
triggering a falling-edge counter based on falling edges in the clock signal;
storing a falling-edge count; and
advancing, a falling-edge incrementer, the falling-edge count by one increment.

19. The synchronous circuit of claim 18 further comprising:
determining one of a difference between the rising-edge count and the falling edge count or whether the rising-edge count and the falling edge count differ.

20. The circuit of claim 18 further comprising
generating, by an inverter, an amplitude-inverted clock signal in response to the clock signal; and
providing an output of the inverter to an input of the falling edge counter.

* * * * *